United States Patent [19]

Suda

[11] Patent Number: 5,767,566
[45] Date of Patent: Jun. 16, 1998

[54] PLASTIC MOLD TYPE SEMICONDUCTOR DEVICE

[75] Inventor: Toru Suda, Tokyo, Japan

[73] Assignee: Kabushiki Kaisha Toshiba, Kawasaki, Japan

[21] Appl. No.: 698,244

[22] Filed: Aug. 15, 1996

[30]     Foreign Application Priority Data

Oct. 18, 1995  [JP]  Japan .................................. 7-270031

[51] Int. Cl.⁶ .............................................. H01L 23/495
[52] U.S. Cl. ........................ 257/666; 257/676; 257/784
[58] Field of Search ................................ 257/666, 676, 257/784, 782, 786

[56]                 References Cited

U.S. PATENT DOCUMENTS 5,220,195   6/1993   McShane et al. ....................... 257/666

*Primary Examiner*—Tom Thomas
*Assistant Examiner*—Roy Potter
*Attorney, Agent, or Firm*—Finnegan, Henderson, Farabow, Garrett & Dunner, L.L.P.

[57]                  ABSTRACT

The semiconductor device according to the present invention can prevent the peeling-off of the chip from the die pad or the crack in the package by improving the efficiency of discharging of the moisture in the device even if the pitch of the inner leads is small, and can improve the reliability of the semiconductor device. The semiconductor device according to the present invention comprises a die pad holding a semiconductor chip, leads, bonding wires, and a plastic package containing the semiconductor chip, the die pad, a part of each of the leads, and the bonding wires. The bonding wires connected to the die pad extend to the outside of the plastic package.

3 Claims, 3 Drawing Sheets

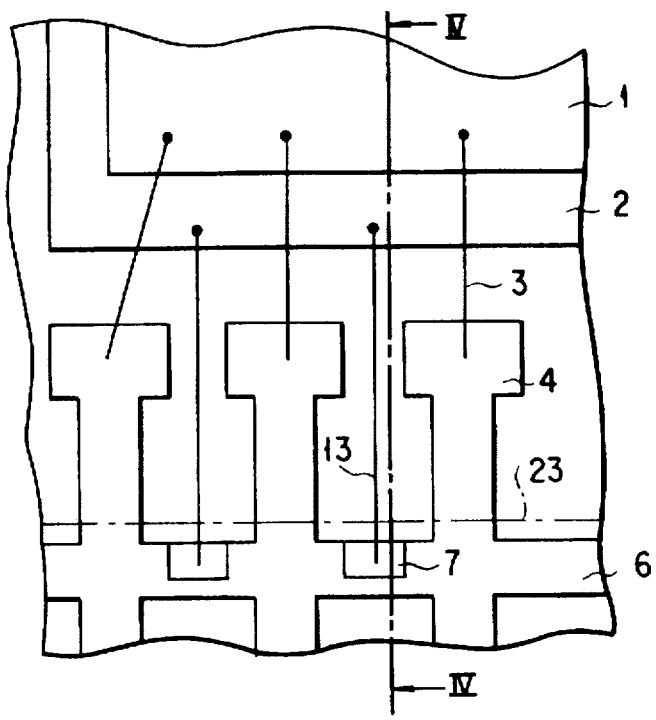
F I G. 3
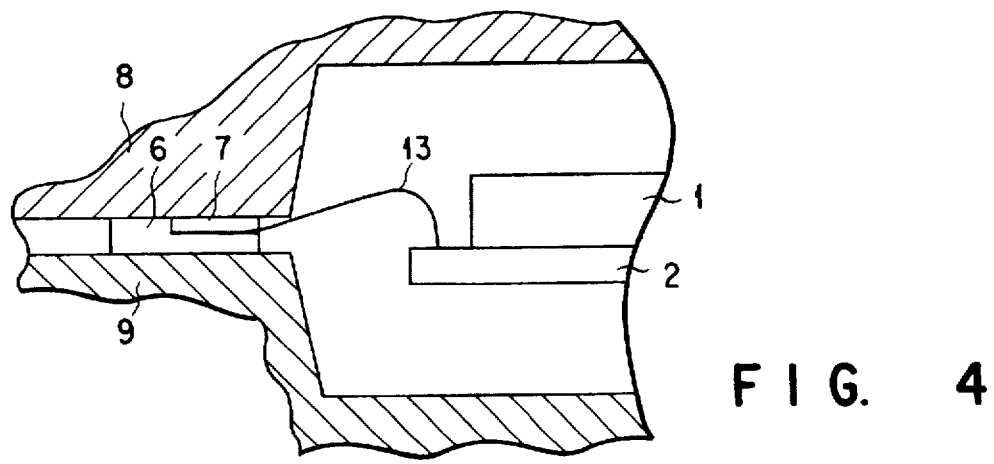
F I G. 4
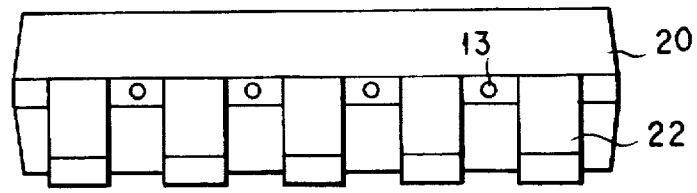
F I G. 5

PLASTIC MOLD TYPE SEMICONDUCTOR DEVICE

BACKGROUND OF THE INVENTION

1. Field of the Invention

This invention relates to a plastic mold type semiconductor device improved in the reliability of package, and to a method of manufacturing the semiconductor device.

2. Description of the Related Art

FIG. 1A is a top view of a conventional plastic mold type semiconductor device. In the device, a semiconductor chip 1 is adhered to a substrate 2 known as die-pad. The terminals of the semiconductor chip 1 is connected to a lead frame 21 by bonding wires 3. First, the lead frame 21 and the chip 1 with its terminals connected to the frame 21 are held between the upper and lower halves of a metal mold, which define a cavity. The portions of the chip 1 and the frame 21, which are indicated by the dot-and-dashed line, are located in the cavity of the metal mold. Sealing resin is forced into the cavity. Part of the resin will flow outside through the spaces formed at the interface between the upper halve of the mold and the inner leads 4 of the frame 21, each space being as thick as the inner leads 4. To prevent the resin from flowing outside the mold, strips 6 called "tie bars" having the same thickness as the inner leads 4 are provided among the inner leads 4. The tie bars 6 are cut off after the resin is filled in the cavity, forming the plastic package.

FIG. 1B is a sectional view of the device shown in FIG. 1A, taken along with a line A—A'. As shown in FIG. 1B, the semiconductor chip 1, die pad 2, bonding wires 3, and a part of lead frame 21 are contained in the plastic package 20. The inner part of the lead frame 21 is located inside of the package 20 and referred to as the inner leads 4, and the outer part of the lead frame 21 is located outside of the package 20 and referred to as outer leads 22.

The plastic mold type semiconductor device shown in FIGS. 1A and 1B is heated at 200° C. or more during the surface mounting process. Due to the high temperature, the moisture in the package is vaporized. As the moisture is vaporized, the $H_2O$ pressure increases. The increased $H_2O$ pressure may peel the semiconductor chip from the die pad or form the crack in the plastic package. Through the peeling or crack, moisture or impurities may further flow into the plastic package and corrode the semiconductor chip. The moisture may soak into the inside of the plastic mold type semiconductor device through the resin bulk surface, or may flow through the interface between the lead frames and the filled resin. In this manner, the flow of moisture inevitably occurs in the plastic mold type semiconductor device, and thus it has been the key of the improvement of the reliability to discharge the moisture from the device.

To discharge the moisture from the device, the conventional plastic mold type semiconductor device is provided with hanging pins 5 for discharging the moisture from the device. FIG. 2 is an enlarged view of the plastic mold type semiconductor device shown in FIG. 1A. As shown in FIG. 2, the hanging pins 5 are provided between the inner leads 4 to connect the die pad 2 with the tie bars 6. After the resin is filled in the region inside of the broken line 23, the package is finished by cutting off the tie bars 6. In the semiconductor device manufactured in this manner, one-end portions of the hanging pins 5 are exposed to the outside of the package. Thus the moisture in the package is discharged from the interface between the hanging pins 5 and the sealing resin 20 along the surface of the hanging pins 5.

However, in the conventional plastic mold type semiconductor device, when the outer leads 22 are juxtaposed at a pitch of less than 0.65 mm, the distance between the inner leads 4 is so narrow that the hanging pins 5 cannot be formed between the inner leads 4. In recent years, more and more pins are incorporated in the package as the integration density of the semiconductor device increases, and thus the distance between the inner leads 4 will inevitably become narrow.

SUMMARY OF THE INVENTION

As described above, in the conventional plastic mold type semiconductor device, when the distance between the inner leads 4 becomes narrow, the hanging pins 5 cannot be formed between the inner leads 4. The moisture therefore cannot be sufficiently discharged from the device, and the peeling-off of the semiconductor chip from the bonding pads or the crack in the plastic package occurs during the heating step of the surface-mounting process. As the result, the reliability of the semiconductor device decreases.

The first object of the present invention is therefore to provide a semiconductor device with high reliability, capable of preventing the peeling-off of the semiconductor chip from the bonding pads or the crack in the plastic package by increasing the moisture discharging efficiency of the device, even if the pitch of the inner leads is small.

The second object of the present invention is to provide a manufacturing method of a semiconductor device with high reliability, capable of preventing the peeling-off of the semiconductor chip from the bonding pads or the crack in the resin package by increasing the moisture discharging efficiency of the device, even if the pitch of the inner leads is small.

In order to solve the above-mentioned problem, the semiconductor device according to the present invention comprises a semiconductor chip; a die pad holding the semiconductor chip; leads; bonding wires connecting bonding pads on the semiconductor chip to the leads; bonding wires each having one end portion connected to the die pad; and a plastic package containing the semiconductor chip, the die pad, a part of each of the leads, and the bonding wires. This semiconductor device is characterized in that the bonding wires connected to the die pad at the one end portion extend such that another end portion of each of the bonding wires is located outside of the plastic package.

Similarly, the manufacturing method of the semiconductor device according to the present invention comprises the steps of bonding a semiconductor chip on a die pad of a lead frame having tie bars, connecting the bonding pads on the semiconductor chip to leads of the lead frame by bonding wires, connecting one end portion of each of the bonding wires on the die pad, packaging the semiconductor chip, the die pad, a part of each of the leads, and the bonding wires, and cutting off the tie bars formed between the leads. This manufacturing method is characterized in that each of the tie bars of the lead frame has a recess for bonding at a portion of an upper surface thereof, another end portions of the bonding wires each having the one end portions connected to the die pad are bonded to the recesses formed on the upper surface of the tie bars, the tie bars formed between the leads are cut off, and the bonding wires are cut off to be exposed to the outside of the plastic package.

As described above, in the semiconductor device according to the present invention, the bonding wires each having the one end portion connected to the die pad extend to the outside of the plastic package, and the moisture exist in the package is effectively discharged to the outside of the package along the surfaces of the bonding wires. The bonding wires of the present invention do not need excess spaces as required by the hanging pins in the conventional semiconductor device, and thus the moisture exist in the package is effectively discharged even if the leads are arranged at narrow intervals and the hanging pins cannot be formed therebetween. By constituting the device in this manner, the present invention can prevent the peeling-off of the semiconductor chip from the die pad or the crack in the plastic package, and can provide the semiconductor device with high reliability.

Further, according to the manufacturing method of the semiconductor device of the present invention, a recess is formed on each of the tie bars of the lead frame at a portion of an upper surface thereof, and the other end portions of the bonding wires each having the one end portions connected to the die pad are bonded to the recesses. In this structure, the upper surfaces of the tie bars do not contact with the metal mold, and the bonding wires can be prevented from being crushed by the metal mold during the molding process. The recesses are filled with resin, and when the tie bars are cut off at the portions between the leads, the resin filled in the recesses is also removed. As the result, the bonding wires bonded to the recesses are exposed to the outside of the plastic package. By exposing the bonding wires to the outside of the package, the present invention can provide the manufacturing method of the semiconductor device with high reliability wherein the peeling-off of the semiconductor chip from the die pad or the crack in the plastic package can be prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a top view of the semiconductor device according to the first embodiment of the present invention.

FIG. 4 is a sectional view of the semiconductor device according to the first embodiment of the present invention.

FIG. 5 is a side view of the semiconductor device according to the first embodiment of the present invention.

DETAILED DESCRIPTION OF THE PREFERRED EMBODIMENTS

Figure 1A:
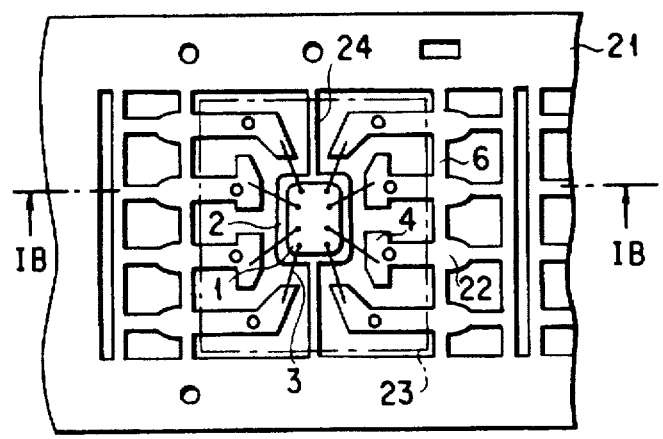
FIG. 1A is a top view of the conventional semiconductor device.
Figure 1B:
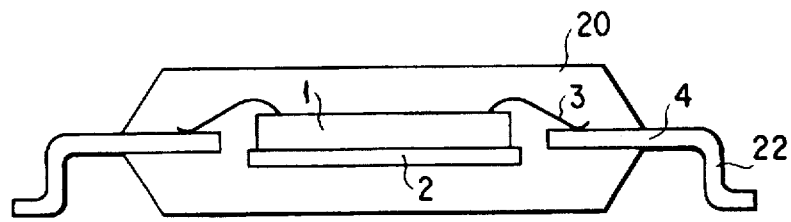
FIG. 1B is a sectional view of the conventional semiconductor device shown in FIG. 1A.
Figure 2:
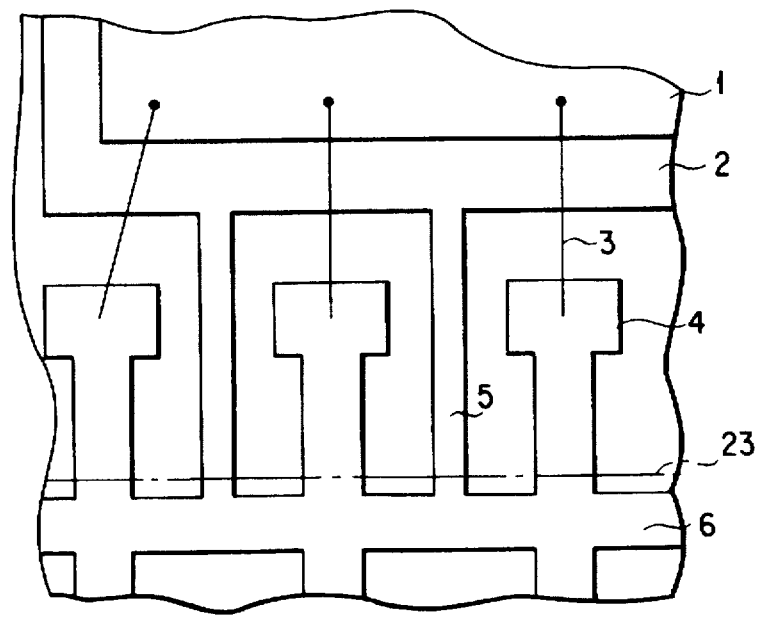
FIG. 2 is an enlarged top view of the semiconductor device shown in FIG. 1A.

This invention can be more fully understood from the following detailed description when taken in conjunction with the accompanying drawings.

FIGS. 3-5 show the first embodiment of the present invention. FIG. 3 shows an enlarged top view of the semiconductor device during the bonding process. FIG. 4 shows a sectional view of the semiconductor device shown in FIG. 3 taken along with a line A—A', during the molding process, and FIG. 5 shows a side view of the finished device. As shown in FIG. 3, a die pad 2 is connected to tie bars 6 by bonding wires 13, instead of the conventional hanging pins. In this time, each of the tie bars 6 has at the upper surface a section 7 (hereinafter referred to as "half etching section") having etched depth of a half of the thickness of the tie bars 6, and the bonding wires 13 are bonded to the upper surface of the half etching section 7, as shown in FIG. 4. By virtue of the half etching sections 7, the bonding wires 13 are prevented from being crushed by the metal molds 8 and 9 during the molding process. After the molding process, the tie bars 6 are cut off as in the conventional method. When the tie bars 6 are cut off, a part of the bonding wires 13 are simultaneously cut off. After the conventional processes are performed, the final semiconductor device can be obtained.

FIG. 5 shows a side view of the finished plastic mold type semiconductor device. As shown in FIG. 5, the bonding wires 13 extend through the spaces between the outer leads 22 so as to be exposed to the outside of the plastic package 20. The moisture in the package is thus effectively discharged to the outside of the package from the die pad 2 along the surfaces of the bonding wires 13 and the interface of the bonding wires 13 and the resin. In this manner, the moisture which tends to collect around the die pad 2 can be effectively discharged to the outside.

In FIG. 3, the half etching sections 7 are formed rectangular, but can be formed in the other shape such as triangle, semicircle, or semioval, if the tie bars 6 are etched on the side of the die pad 2.

Figures 6, 7:
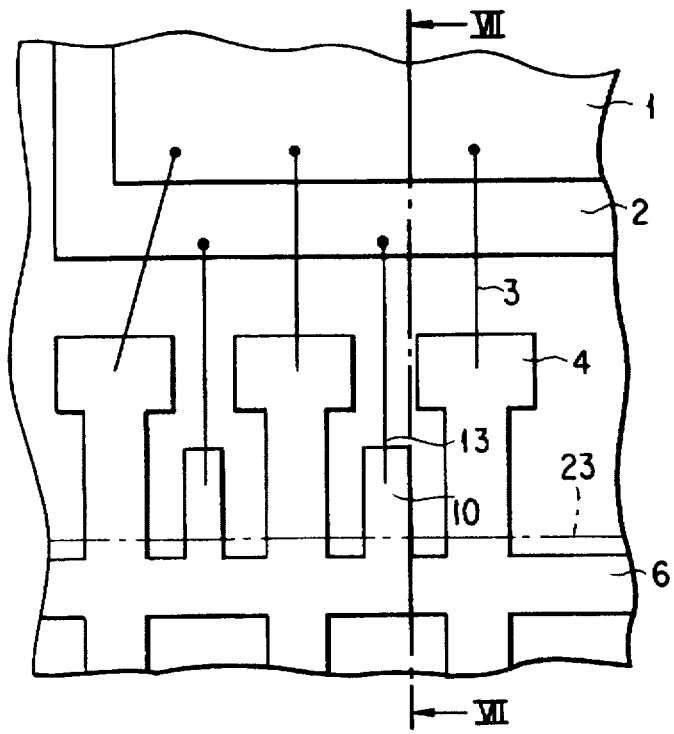
FIG. 6 is a top view of the semiconductor device according to the second embodiment of the present invention.
FIG. 7 is a sectional view of the semiconductor device according to the second embodiment of the present invention.

The second embodiment of the present invention will be described below in conjunction with FIGS. 6 and 7. In the above-mentioned first embodiment, the half etching section 7 needs to be provided by etching a part of each of the tie bars 6 in order to prevent the bonding wires 13 being crushed by the metal molds 8 and 9. In the second embodiment, the tie bars 6 extend to a plastic mold region (the region inside the broken line 23) to form moisture-discharging leads 10 as shown in FIG. 6. FIG. 7 shows that the bonding wire 13 is bonded to the moisture-discharging lead 10. In this manner, the bonding wires 13 can be prevented from being crushed by the metal molds 8 and 9. After the molding process, the tie bars 6 are cut off as in the conventional case, and the semiconductor device as the final product is obtained after the conventional processes performed subsequently. In such a manner, the moisture-discharging leads 10 extend through the spaces between the outer leads 22 so as to be exposed to the outside of the plastic package 20.

According to the second embodiment, the moisture in the package moves from the die pad 2 along the surfaces of the bonding wires 13 and the surfaces of the moisture-discharging leads 10, and arrives at the interface of the moisture-discharging leads 10 and the resin, and is discharged to the outside of the plastic package 20 effectively.

Further, according to the second embodiment, the moisture-discharging leads 10 are formed integrally with the lead frame, and thus any new process does not need to be performed, unlike the first embodiment wherein a manufacturing step is needed for forming the half etching sections 7.

In general, the inner leads of the plastic mold type semiconductor device are formed to have a larger width than that of the outer leads, as shown in FIG. 6, in order to prevent the inner leads from falling out of the plastic package. The distance between the inner leads is therefore smaller than that of the outer leads. In such a structure, in the portion in which the distance between the inner leads are large, the moisture-discharging leads 10 as described in the above-mentioned second embodiment can be formed, and in the portion in which the distance between the inner leads are small, the bonding wires 13 can be used for discharging moisture. In this manner, the present invention can effectively discharge the moisture in the device even if the distance between the inner leads 4 are small.

Further, according to the present invention, the die pad 2 can be connected over the inner leads 4 to the tie bars 6 or the moisture-discharging leads 10 by use of the bonding wires 13. Therefore, the moisture in the device can be effectively discharged however the shape of the inner leads 4 is.

In FIG. 6, the moisture-discharging leads 10 are formed rectangular, but can be formed in various shapes if each of the moisture-discharging leads 10 is arranged in each of the spaces between the inner leads 4.

In the above two embodiment, one bonding wire 13 is arranged between each of the inner leads 4, but a plurality of bonding wires 13 can be arranged between each of the inner leads 4. By arranging the bonding wires 13 in such a manner, the total surface area of the bonding wires can be increased, and the moisture in the device can be more effectively discharged.

On the other hand, each of the inner leads 4 does not need to be provided with the bonding wire 13, and thus one or a plurality of bonding wires 13 may be provided to a plurality of inner leads 4. However, in order to discharge the moisture in the package 20 as effectively as possible, it is preferable to arrange one bonding wire 13 between each of the inner leads 4.

The thickness of the bonding wire made of Au (gold) generally used in the plastic mold type semiconductor device is approximately 20 μm. Therefore, when the length of the bonding wire 13 is more than 5 mm, the bonding wire 13 may fall down while the resin is filled, with the result that the short circuit may occur between the inner leads 4. In order to avoid such a fault, the length of the bonding wire 13 needs to be set at 5 mm or less. Even if the die pad 2 and the tie bars 6 are distant, the bonding wires 13 can remain short by applying the second embodiment of the present invention wherein the moisture-discharging leads 10 are formed. The wire length suitable for the bonding wire varies according to the material of the bonding wire. The bonding wire can be lengthened as the hardness of material of the bonding wire increases.

The present invention is particularly useful for the plastic mold type semiconductor device having a surface-mounting package, such as SOP (Small Outline Package), QFP (Quad Flat Package), SOJ (Small Outline J-leaded package), and QFJ (Quad Flat J-leaded package), but can be applied to all the plastic mold type semiconductor device.

Accordingly, the semiconductor device according to the present invention can prevent the peeling-off of the chip from the die pad or the crack in the package by improving the efficiency of discharging of the moisture in the device even if the pitch of the inner leads is small, therefore can improve the reliability of the semiconductor device.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

a semiconductor chip;

a die pad holding the semiconductor chip;

leads;

first bonding wires connecting bonding pads on the semiconductor chip to the leads;

second bonding wires each having one end portion connected to the die pad; and a plastic package containing the semiconductor chip, the die pad, a part of each of the leads, and the first and second bonding wires, wherein another end portion of each of the second bonding wires connected to the die pad at the one end portion extends to outside of the plastic package.

2. A semiconductor device according to claim 1, characterized in that at least a part of each the second bonding wires connected to the die pad extends outside of the plastic package through each of spaces between the leads.

3. A semiconductor device according to claim 2, characterized in that at least one of the second bonding wires is arranged each of the spaces between the leads.

* * * * *